United States Patent [19]

Kim

[11] Patent Number: 5,608,683
[45] Date of Patent: Mar. 4, 1997

[54] REFRESH METHOD OF REUSING ELECTRIC CHARGE

[75] Inventor: Ji-Bum Kim, Seoul, Rep. of Korea

[73] Assignee: LG Semicon Co., Ltd., Cheongju, Rep. of Korea

[21] Appl. No.: 586,394

[22] Filed: Jan. 16, 1996

[30] Foreign Application Priority Data

Oct. 13, 1995 [KR] Rep. of Korea .................. 35383/1995

[51] Int. Cl.⁶ ...................................................... G11C 7/00
[52] U.S. Cl. .................... 365/222; 365/230.03; 365/190; 365/204; 365/236; 365/230.04
[58] Field of Search .............................. 365/222, 230.03, 365/190, 204, 236, 230.04

[56] References Cited

U.S. PATENT DOCUMENTS 4,570,242  2/1986  Nagami ................................... 365/222
5,270,971  12/1993  Muraoka et al. .................. 365/189.01

Primary Examiner—David C. Nelms
Assistant Examiner—Andrew Q. Tran
Attorney, Agent, or Firm—Fleshner & Kim

[57] ABSTRACT

A refresh method of reusing electric charges from a refresh operation of a first memory array for pre-charging in an initial refresh operation of a second memory array in which charges that are charged/discharged to a bit line and its complementary bit line of one memory array via switching units provided between the one memory array and another memory array when performing a refresh operation in the one memory array are also used for performing an initial refresh operation of the other memory array, thereby reducing back-up currents by reducing refresh currents, and prolonging the life of dry cells or batteries for hours.

4 Claims, 4 Drawing Sheets

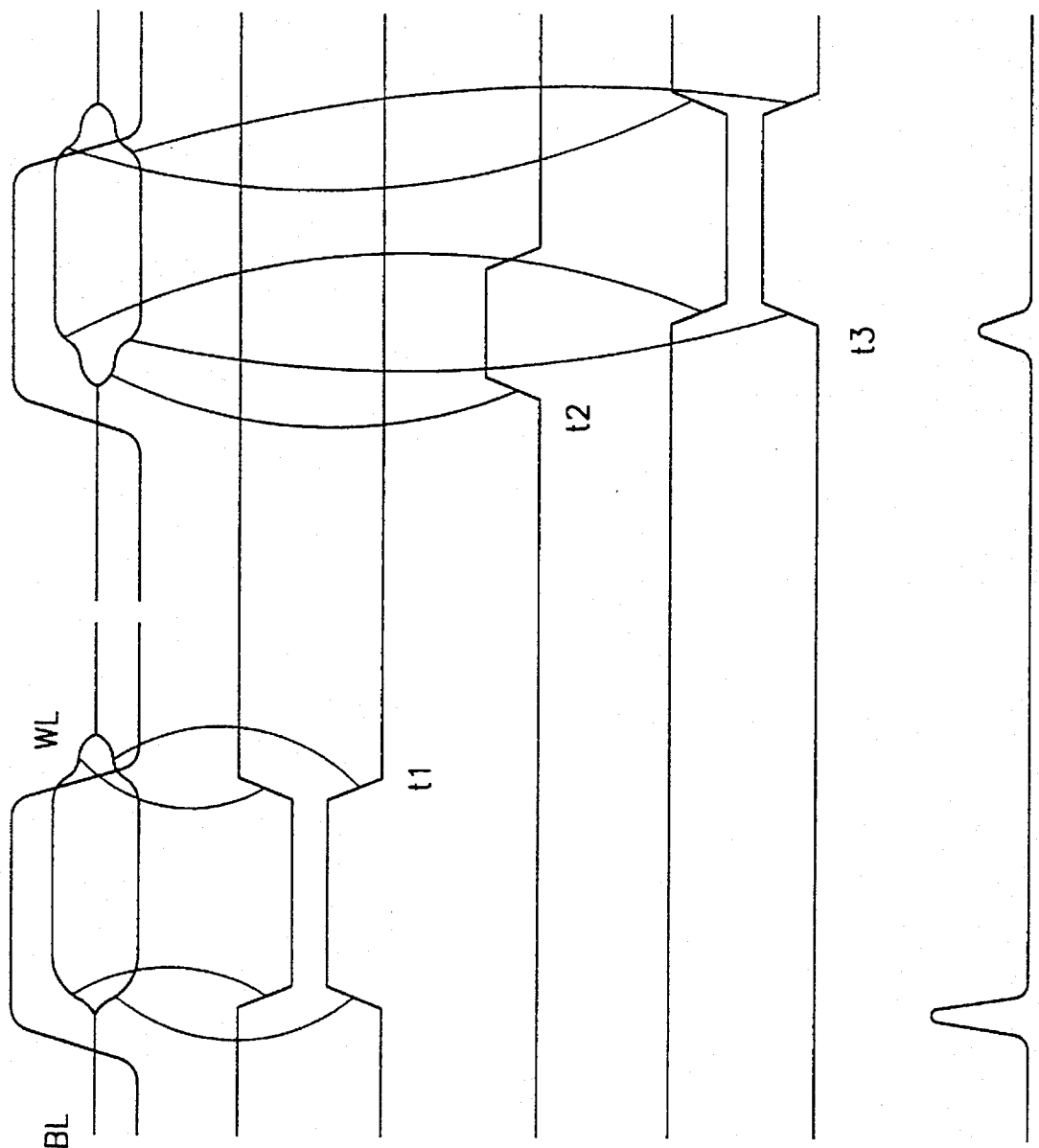

REFRESH METHOD OF REUSING ELECTRIC CHARGE

BACKGROUND OF THE INVENTION

1. Field of the Invention

The present invention relates to a refresh method of a semiconductor memory device, and particularly to a refresh method of reusing electric charges in which the charges that are charged/discharged to a bit line and its complementary bit line via common source lines when performing a refresh operation in one memory array are also used for performing an initial refresh operation of another memory array, thereby reducing refresh current requirements.

2. Description of the Conventional Art

Referring to FIG. 1, there is shown a construction of a conventional memory array whereby, the conventional 4-MBit memory array includes a memory unit 10 for writing and reading data to/from memory cells connected to a plurality of word lines WL1 to WLn and a plurality of bit line pairs BL1, BLB1, ... BLn, BLBn; a sense amplification unit 20 respectively connected to bit lines pairs BL1, BLB1, ... BLn, BLBn of the memory unit 10 for performing a sensing operation of data; and a power supply unit 30 for supplying electric power to the sense amplification unit 20.

The sense amplification unit 20 includes a plurality of CMOS sense amplifiers S/A1 to S/An. The sense amplifier S/A1 of the sense amplification unit 20 includes PMOS transistors 11 and 12 each having a source connected to a common node N5, a drain connected to the bit line BL1 and its complementary bit line BLB1 respectively, and a gate to which the bit line BL1 and its complementary bit line BLB1 are crosswise connected; and NMOS transistors 13 and 14 each having a source connected to a common node N6, a drain connected to the bit line BL1 and its complementary bit line BLB1 respectively, and a gate to which the bit line BL1 and its complementary bit line BLB1 are crosswise connected. The structure of the sense amplifiers S/A2 to S/An is similar to that of the sense amplifier S/A1.

The power supply unit 30 includes a PMOS transistor 15 having a source to which a supply voltage Vcc is applied, a gate to which a row address strobe signal RAS outputted from a RAS signal generator is inputted, and a drain to which the common node N5 of the plurality of sense amplifiers S/A1 to S/An is connected; and an NMOS transistor 16 having a source to which a ground voltage Vss is applied, a gate to which a signal /RAS outputted from the RAS signal generator is inputted, and a drain to which the common node N6 of the sense amplifiers S/A1 to S/An is connected.

In the case of a 16-Mbit semiconductor chip, four (4) 4-MBit memory arrays having the above-described structure are included.

A "CAS (column address strobe) Before RAS" refresh method of the 4-MBit memory array in the conventional semiconductor chip is explained referring to FIGS. 1 and 2.

First, when a word line WL1 is selected by a refresh counter, data "0" is outputted to a bit line BLB1 from a memory cell connected to the selected word line WL1 and the bit line BLB1. The outputted data "0" is inputted to each gate of the NMOS transistor 13 and the PMOS transistor 12 of the sense amplifier S/A1 via the nodes N1 and N2, thereby causing the NMOS transistor 13 to be turned off and the PMOS transistor 12 to be turned on.

When the signals RAS and /RAS of FIG. 2B are respectively applied to the gates of the PMOS transistor 15 and the NMOS transistor 16 of the power supply unit 30, the PMOS transistor 15 and the NMOS transistor 16 are turned on, and thereby the supply voltage Vcc and the ground voltage Vss are respectively inputted to the common nodes N5 and N6 of the sense amplifier S/A1 via common source lines CSL1 and CSL2.

Afterwards, the supply voltage Vcc inputted to the common node N5 is applied to the bit line BL1 via the PMOS transistor 12 which is turned on, and the bit line BL1 being maintained at one-half the supply voltage ½Vcc is charged to the supply voltage Vcc level. The charged electric charges are inputted to the gates of the PMOS transistor 11 and the NMOS transistor 14 of the sense amplifier S/A1 via the nodes N3 and N4.

Accordingly, the PMOS transistor 11 is turned off and the PMOS transistor 14 is turned on. The electric charge of the bit line BLB1 being maintained at one-half the supply voltage Vcc, i.e., to ½Vcc are discharged via the common source line CSL2 and maintained at the ground voltage Vss level. Thereafter, when a word line WL1 is disabled, the bit line BL1 and its complementary bit line BLB1 become charged at the level of one-half the supply voltage Vcc, namely, to ½Vcc.

Further, the refresh processes of the sense amplifiers S/A2 to S/An are similar to those of the sense amplifier S/A1.

The refresh operation of each 4-MBit memory array is explained as follows. The word line is selected by the refresh counter, and after the sense amplifiers are driven by using the data stored in the memory cells connected to the selected word line, the electric charges are charged/discharged to the bit line BL and its complementary bit line BLB by the voltage of the power supply unit.

However, when the "CAS Before RAS" refresh operation of the 4-MBit memory array is performed, a peak current, i.e., refresh current flows at the time the electric charges are charged/discharged to the bit line BL and its complementary bit line BLB, as shown in FIG. 2C.

Accordingly, in the case of a 16-Mbit semiconductor chip where four (4) 4-Mbit memory arrays respectively perform a refresh operation, the refresh current is increased and there are difficulties in decreasing the noise margin and meeting the memory characteristic requirements when designing semiconductor chips. Particularly, for notebook computers or personal data apparatuses, there is a problem in that the life of dry cells or batteries becomes short since the battery backup current is increased.

SUMMARY OF THE INVENTION

Therefore, it is an object of the present invention to provide a refresh method of reusing electric charges in which the charges that are charged/discharged to a bit line its complementary bit line via common source lines when performing a refresh operation in one memory array are also used for performing an initial refresh operation of another memory array, thereby reducing the required refresh currents and backup currents of personal data apparatuses.

To achieve the above-mentioned object, the present invention includes a first step for performing a refresh operation of a first memory array by operating a sense amplifier with data outputted from memory cells on the word line selected by a refresh counter, and charging/discharging a bit line and its complementary bit line of the first memory array with electric charges of a supply voltage level and a ground voltage level; a second step for transmitting the electric charges charged/discharged to the bit line BL and its complementary bit line BLB to a second memory array after the refresh operation of the first step; and a third step for using the transmitted electric charges in an initial refresh operation of the second memory array, and performing a refresh operation of the second memory array by charging/discharging the bit line and its complementary bit line with electric charges of the supply voltage level and ground voltage level.

BRIEF DESCRIPTION OF THE DRAWINGS

The above object and advantages of the present invention will be more clearly understood from the following detailed description taken in conjunction with the accompanying drawings, in which:

FIGS. 4A to 4E are timing diagrams of a refresh operation performed in the memory arrays in FIG. 3.

DETAILED DESCRIPTION OF THE PREFERRED EMBODIMENTS

Figure 3:
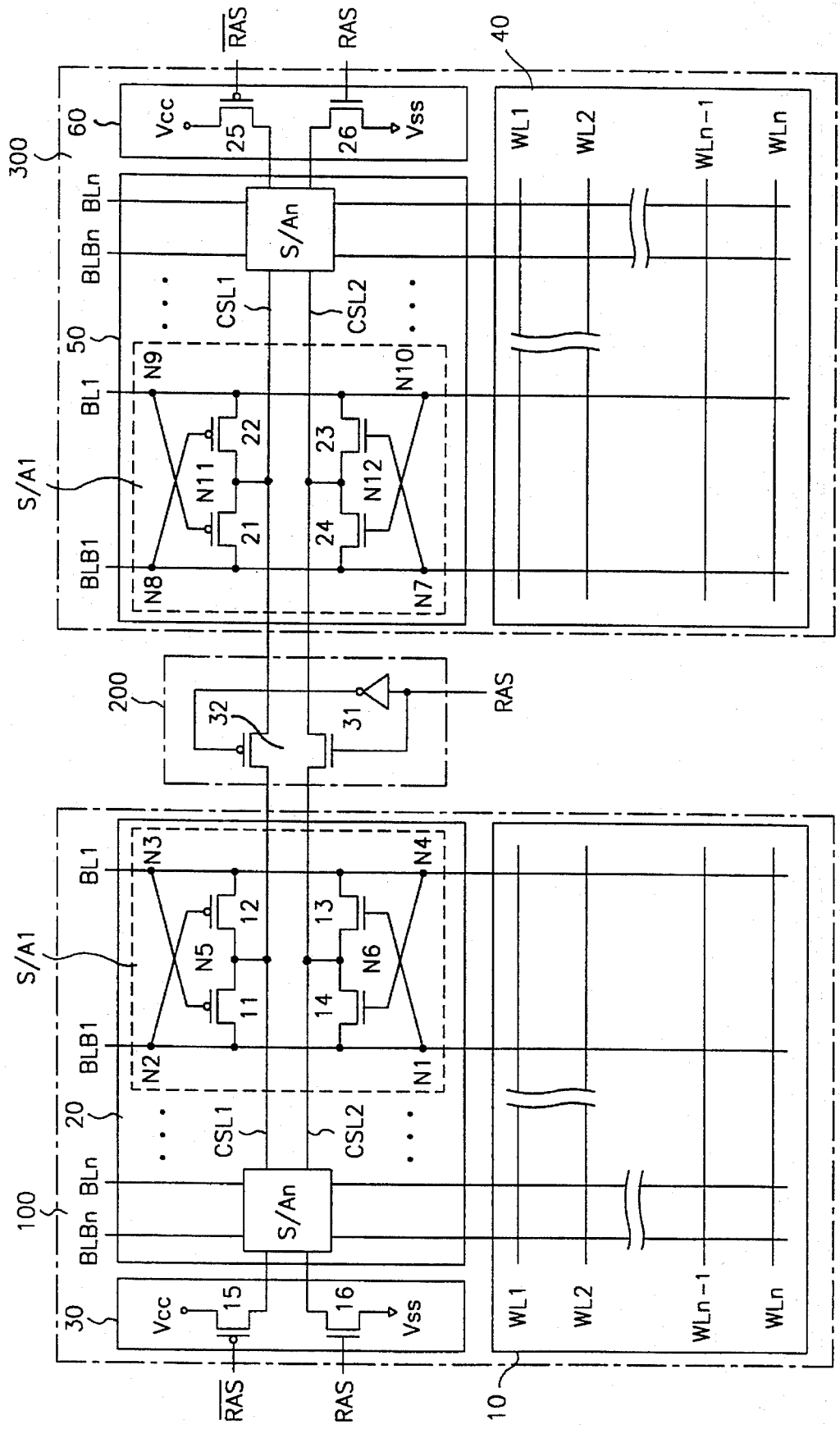
FIG. 3 is a schematic diagram of the construction of memory arrays according to the present invention.

Referring to FIG. 3, there is shown a construction of memory arrays adapting the refresh method according to the present invention. As shown in the drawing, the memory device to which the method of the present invention is applied includes a memory array 100 for performing a refresh operation by enabling a plurality of sense amplifiers S/A1 to S/An with data stored in memory cells connected to the word line WL selected by the refresh counter, and by charging/discharging electric charges to the bit line pairs BL1, BLB1, . . . BLn, BLBn; a switching unit 200 for receiving the electric charges charged/discharged to the bit line BL and its complementary bit line BLB of the memory array 100 via common source lines after a refresh operation, and transmitting the charges in accordance with an externally applied signal RAS; and a memory array 300 for receiving the electric charges transmitted via the switching unit 200 and after using the electric charges in an initial refresh operation thereof, performing a refresh operation thereof by charging/discharging therein the bit line BL and its complementary bit line BLB with electric charges of the supply voltage level and ground voltage level.

Figure 1:
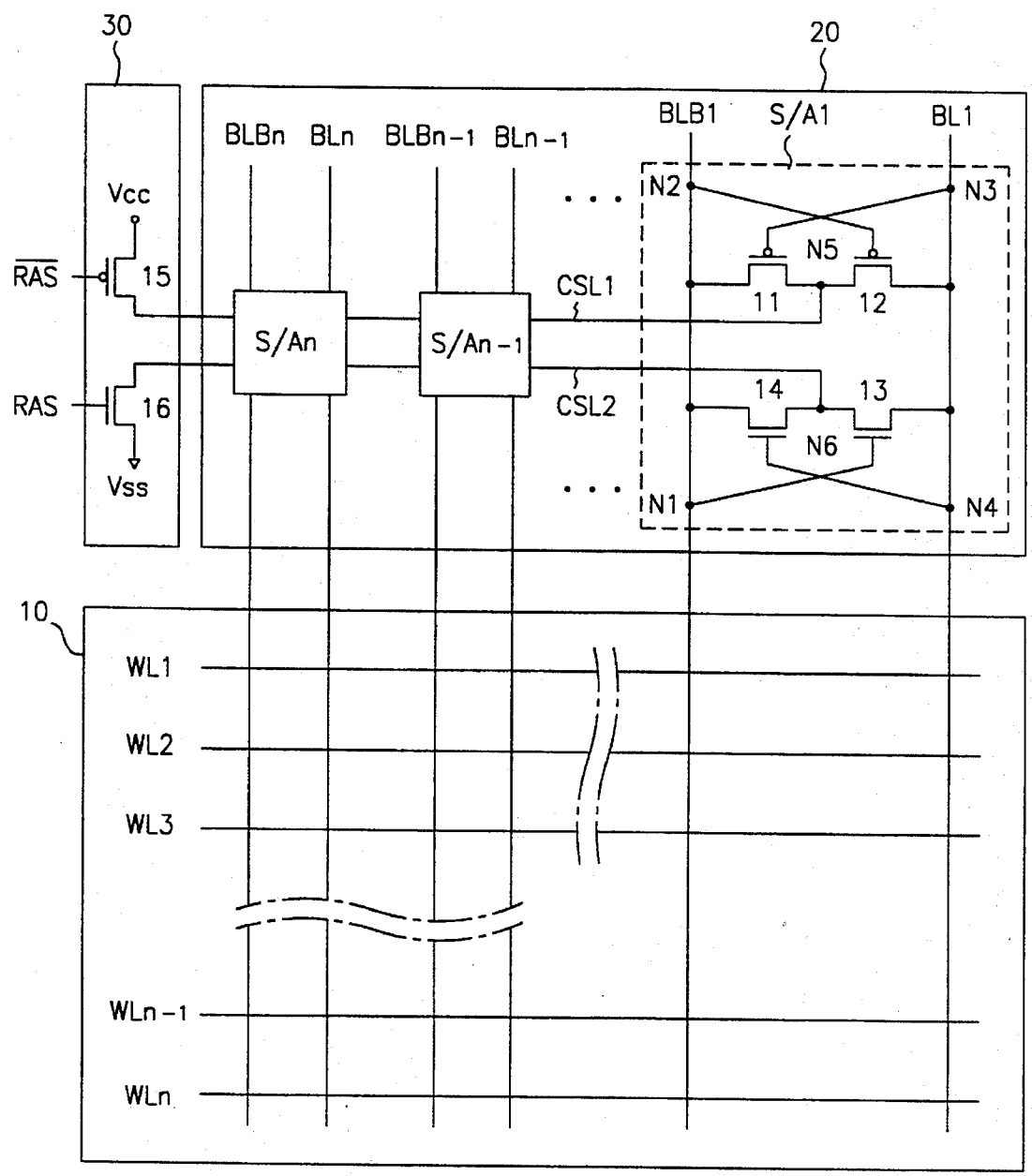
FIG. 1 is a diagram showing schematically the construction of a 4-MBit memory array of a semiconductor chip.
Figures 2A, 2B, 2C:
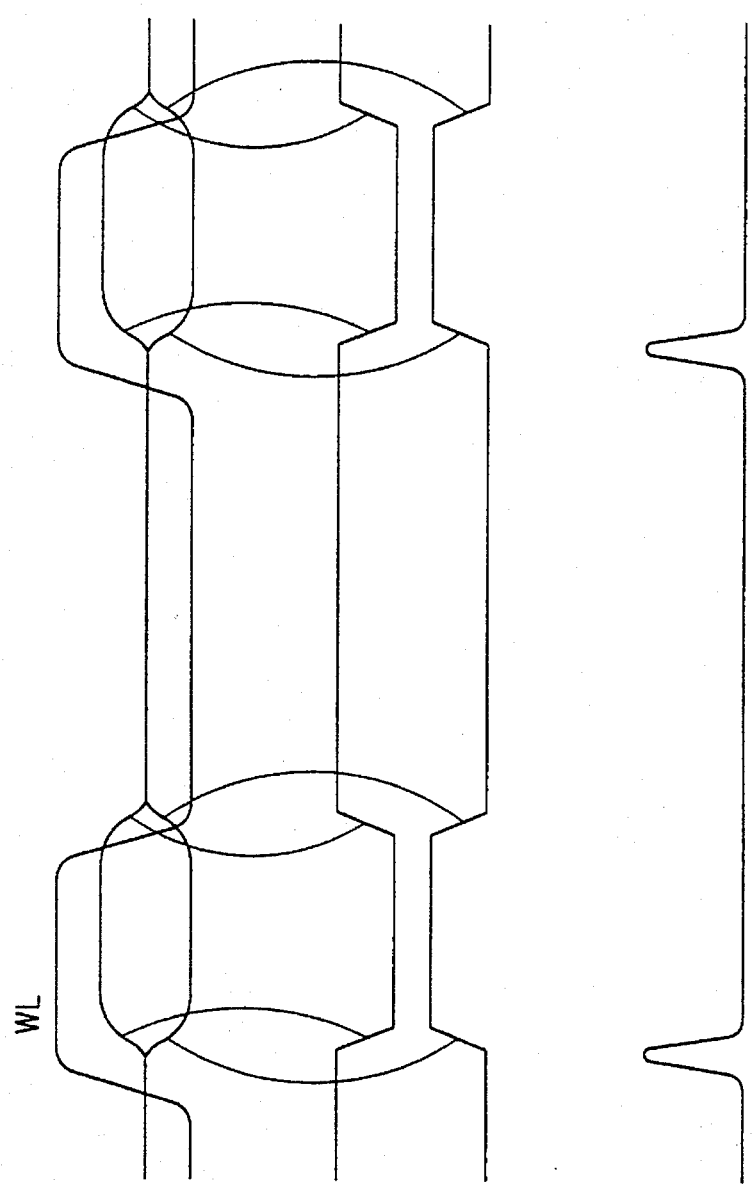
FIGS. 2A to 2C are timing diagrams of a refresh operation performed in the memory array in FIG. 1.

The structure and reference numeral designation of the memory array 100 are similar to those of the 4-MBit memory array shown in FIG. 1. The memory array 300 is structurally the same as the 4-MBit memory array shown in FIG. 1, but the reference numerals designating elements thereof are different.

The switching unit 200 includes a transmission gate 32 for transmitting the inputted electric charges according to the signal RAS and the signal RAS inverted by the inverter 31.

Referring to FIGS. 3 and 4, the refresh method of reusing the electric charges in the memory array having above-described structure will be explained.

First, the refresh method in the memory array 100 is similar to the method of the conventional art.

Electric charges are charged/discharged to the bit line BL1 and its complementary bit line BLB1 by performing a refresh operation in the memory array 100, as shown in FIG. 4A, when the signal RAS applied to the power supply unit 30 is disabled at time t1. As shown in FIG. 4B, the electric charges which are charged/discharged to the bit BL1 and its complementary bit line BLB1 are equalized to one-half the supply voltage Vcc, namely, to ½Vcc.

At this time, when the word line WL2 is selected by the refresh counter in the memory array 300, data "0" of a memory cell connected to the word line WL2 and the bit line BLB1 of the memory unit 40 is outputted to the bit line BLB1, and inputted to the gates of each of an NMOS transistor 23 and a PMOS transistor 22 of the sense amplifier S/A1 via nodes N7 and N8, thereby causing the NMOS transistor 23 to be turned off and the PMOS transistor 22 to be turned on.

Afterwards, when the signal RAS is inputted to the switching unit 200 at time t2, as shown in FIG. 4C, the transmission gate 32 is turned on, and the electric charges which are charged/discharged to the bit line BL1 and its complementary bit line BLB1 of the memory array 100 are inputted to the memory array 300 via common source lines CSL1 and CSL2.

The electric charges inputted via the common source lines CSL1 and CSL2 are inputted to common nodes N11 and N12 of the sense amplifier S/A1 of memory array 300. The electric charges inputted via the common node N11 start to be charged to the bit line BL1 via the PMOS transistor 22 which is turned on, and the electric charges charged to the bit line BL1 are inputted to the gates of each of the PMOS transistor 21 and the NMOS transistor 24 of the sense amplifier S/A1 via nodes N9 and N10. Thereafter, the PMOS transistor 21 is turned off and the PMOS transistor 24 is turned on, thereby allowing the electric charges in the bit line BLB1 of the memory array 300 to be discharged via the common node N12 and the common source line CSL2.

Accordingly, the electric charges being equalized to one-half the supply voltage Vcc, namely, to ½Vcc at time t1 after being charged/discharged to the bit line BL1 and its complementary bit line BLB1 of the memory array 100, are charged/discharged to the bit line BL1 and its complementary bit line BLB1 of the memory array 300 via the common source lines CSL1 and CSL2 and the switching unit 200.

Afterwards, when the signals RAS and /RAS are respectively inputted to the gates of each of the PMOS transistor 25 and the NMOS transistor 26 of the power supply unit 60, as shown in FIG. 4D, the PMOS transistor 25 and the NMOS transistor 26 are respectively turned on, and thereby the supply voltage Vcc and the ground voltage Vss applied to their respective sources are charged/discharged to the bit line BL1 and its complementary bit line BLB1 of the memory array 300 via the common source lines CSL1 and CSL2 and the common nodes N11 and N12 of the sense amplifier S/A1, and the refresh operation of the memory array 300 is performed.

Accordingly, as described above, the plurality of sense amplifiers S/A2 to S/An of the memory array 300 perform an initial refresh operation by receiving the electric charges charged/discharged to the bit line BL and its complementary bit line BLB of memory array 100 via the switching unit 200 and the common nodes N11 and N12, in accordance with the word line WL in memory array 300 selected in the refresh counter. Thereafter, a refresh operation is performed by charging/discharging the electric charges to the bit line BL and its complementary bit line BLB with the supply voltage Vcc and the ground voltage Vss outputted from the power supply unit 60, thereby reducing a refresh current generated in the initial refresh operation of the memory array 300, as shown in FIG. 4E.

Additionally, the refresh counter alternately selects the word lines of the memory array 100 and memory array 300, and performs the refresh operation continuously. Although the refresh operation of the memory array 300 is performed first and the refresh operation of the memory array 100 is performed afterwards, the same operation may be achieved even if this order is reversed.

As described above, according to the present invention, the charges that are charged/discharged to a bit line and its complementary bit line via common source lines when performing a refresh operation in one memory array are also used for performing an initial operation of another memory array, thereby reducing backup currents of personal data apparatuses by reducing refresh currents, and permitting using dry cells and or batteries for hours.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A refresh method for a semiconductor memory device having first and second memory arrays, comprising:

a first step for performing a refresh operation of said first memory array by operating a sense amplifier with data outputted from memory cells on a word line selected by a refresh counter, and charging/discharging a bit line and its complementary bit line of the first memory array with electric charges of a supply voltage level and a ground voltage level;

a second step for transmitting the electric charges charged/discharged to the bit line and its complementary bit line of the first memory array to said second memory array after performing the refresh operation of the first step; and a third step for using the transmitted electric charges in an initial refresh operation of the second memory array, and performing a refresh operation by charging/discharging a bit line and its complementary bit line of the second memory array with electric charges of the supply voltage level and ground voltage level respectively supplied from a power supply means.

2. The method of claim 1, wherein said refresh counter alternately selects the word lines of said first memory array and word lines of said second memory array, and performs the refresh operation continuously.

3. The method of claim 1, wherein in the second step, common source lines between said first and second memory arrays are connected after electric charges charged/discharged to the bit line and its complementary bit line of the first memory array are equalized to one-half of the supply voltage level, and after selected word lines of the second memory array are enabled.

4. The method of claim 3, wherein in the third step, said supply voltage level and ground voltage level from said power supply means are applied before said common source lines are disconnected.

* * * * *